US006628047B1

(12) United States Patent
Rhyne

(10) Patent No.: US 6,628,047 B1
(45) Date of Patent: Sep. 30, 2003

(54) BROADBAND ULTRASONIC TRANSDUCERS AND RELATED METHODS OF MANUFACTURE

(75) Inventor: Theodore L. Rhyne, Whitefish Bay, WI (US)

(73) Assignee: General Electric Company, Waukesha, WI (US)

( * ) Notice: Subject to any disclaimer, the term of this patent is extended or adjusted under 35 U.S.C. 154(b) by 40 days.

(21) Appl. No.: 08/960,132

(22) Filed: Feb. 10, 1997

Related U.S. Application Data

(63) Continuation of application No. 08/091,581, filed on Jul. 15, 1993, now abandoned.

(51) Int. Cl.[7] .............................................. H01L 41/08
(52) U.S. Cl. ........................ 310/334; 310/336; 310/327
(58) Field of Search ................................ 310/327, 334, 310/336, 357–359

(56) References Cited

U.S. PATENT DOCUMENTS

| | | | | | |
|---|---|---|---|---|---|
| 3,389,343 A | * | 6/1968 | Newell | 310/336 |
| 3,555,311 A | * | 1/1971 | Weber | 310/336 |
| 3,671,784 A | * | 6/1972 | Mitchell | 310/358 |
| 4,507,582 A | * | 3/1985 | Glenn | 310/334 |
| 4,518,889 A | * | 5/1985 | T'Hoen | 310/357 |
| 4,680,499 A | * | 7/1987 | Umemura et al. | 310/334 |
| 4,692,654 A | * | 9/1987 | Umemura et al. | 310/334 |
| 4,714,848 A | * | 12/1987 | Chen | 310/359 |
| 4,721,106 A | * | 1/1988 | Kurtze et al. | 128/328 |
| 5,030,874 A | * | 7/1991 | Saito et al. | 310/334 |
| 5,060,201 A | * | 10/1991 | Ishikawa et al. | 367/7 |

FOREIGN PATENT DOCUMENTS

| | | | | |
|---|---|---|---|---|
| JP | 55-151893 | | 11/1980 | H04R/1/32 |
| JP | 0202112 | * | 12/1982 | 310/357 |
| JP | 58-170200 | | 10/1983 | H04R/17/00 |
| JP | 0012899 | * | 1/1985 | 310/327 |
| JP | 6148299 | * | 3/1986 | H04R/17/00 |
| JP | 6148300 | * | 3/1986 | H04R/17/00 |
| JP | 63-314907 | | 12/1988 | H03H/9/17 |
| JP | 03-121000 | | 5/1991 | H04R/17/00 |
| JP | 03-186252 | | 8/1991 | A61B/8/00 |

OTHER PUBLICATIONS

"Fabrication of non–uniformly excited wide–band ultrasonic transducers," by R. Brittain et al. Jun. 5, 1986, Ultrasonics Mar. 1987.*

"Dual Frequency Piezoelectric Transducer for Medical Applications," Bolorforosh, SPIE Proc., vol. 1733, pp. 131–140. Jun. 1993.

"A Staircase Model of Tapered Piezoelectric Transducers," Barth et al., 1987 Ultrasonics Symp., pp. 697–700., Jul. 1987.

"Analysis of the Mechanically–Uncoupled Electric Resonance in Tapered Thickness Piezoelectric Transducers," Barthe et al., 1988 Ultrasonic Symp., pp. 717–720; Jul. 1988.

* cited by examiner

*Primary Examiner*—Thomas M. Dougherty
(74) *Attorney, Agent, or Firm*—Ostrager Chong & Flaherty LLP

(57) ABSTRACT

A broadband ultrasonic transducer has a layer of piezoelectric material sandwiched between respective layers of backing and matching material. The piezoelectric element is coupled to a pair of electrical terminals, across which a varying voltage is produced. The piezoelectric layer has a structure such that in response to the varying voltage, a forward-propagating wave emanating from its back surface does not destructively interfere with a forward-propagating wave emanating from its front surface when the frequency of the waves is an even multiple of the half-wave frequency of the particular piezoelectric layer. This effect can be attained by roughening the back surface of the piezoelectric layer or by spatially varying the piezoelectric coupling in the thickness direction in a portion of the piezoelectric layer which is proximate to the back surface.

8 Claims, 3 Drawing Sheets

BROADBAND ULTRASONIC TRANSDUCERS AND RELATED METHODS OF MANUFACTURE

This is a continuation of copending application Ser. No. 08/091,581 filed on Jul. 15, 1993 now abandoned.

FIELD OF THE INVENTION

This invention generally relates to ultrasonic transducers comprising piezoelectric elements sandwiched between backing/matching layers. In particular, the invention relates to a method for constructing ultrasonic transducers having an improved bandwidth.

BACKGROUND OF THE INVENTION

Conventional ultrasonic transducers for medical applications are constructed from one or more piezoelectric elements sandwiched between a pair of backing/matching layers. Such piezoelectric elements are constructed in the shape of plates or rectangular beams bonded to the backing and matching layers. The piezoelectric material is typically lead zirconate titanate (PZT), polyvinylidene difluoride (PVDF), or PZT ceramic/polymer composite.

Almost all conventional transducers use some variation of the geometry shown in FIG. 1. The basic ultrasonic transducer 2 consists of layers of materials, at least one of which is a piezoelectric plate 4 coupled to a pair of electric terminals 6 and 8. The electric terminals are connected to an electrical source having an impedance $Z_s$. When a voltage waveform v(t) is developed across the terminals, the material of the piezoelectric element compresses at a frequency corresponding to that of the applied voltage, thereby emitting an ultrasonic wave into the media to which the piezoelectric element is coupled. Conversely, when an ultrasonic wave impinges on the material of the piezoelectric element, the latter produces a corresponding voltage across its terminals and the associated electrical load component of the electrical source.

Typically, the front surface of piezoelectric element 4 is covered with one or more acoustic matching layers or windows (e.g., 12 and 14) that improve the coupling with the media 16 in which the emitted ultrasonic waves will propagate. In addition, a backing layer 10 is coupled to the rear surface of piezoelectric element 4 to absorb ultrasonic waves that emerge from the back side of the element so that they will not be partially reflected and interfere with the ultrasonic waves propagating in the forward direction. A number of such ultrasonic transducer constructions are disclosed in U.S. Pat. Nos. 4,217,684, 4,425,525, 4,441,503, 4,470,305 and 4,569,231, all of which are commonly assigned to the instant assignee.

The basic principle of operation of such conventional transducers is that the piezoelectric element radiates respective ultrasonic waves of identical shape but reverse polarity from its back surface 18 and front surface 20. These waves are indicated in FIG. 1 by the functions $P_b(t)$ and $P_f(t)$ for the back and front surfaces respectively. A transducer is said to be halfwave resonant when the two waves constructively interfere at the front face 20, i.e., the thickness of the piezoelectric plate equals one-half of the ultrasonic wavelength. The half-wave frequency $f_o$ is the practical band center of most transducers. At frequencies lower than the half-wave resonance, the two waves interfere destructively so that there is progressively less and less acoustic response as the frequency approaches zero. Conversely, for frequencies above the half-wave resonance there are successive destructive interferences at $2f_o$ and every subsequent even multiple of $f_0$. Also, there are constructive interferences at every frequency which is an odd multiple of $f_0$. The full dynamics of the transducer of FIG. 1 involve taking into account the impedances of each layer and the subsequent reflection and transmission coefficients. The dynamics of the transducer are tuned by adjusting the thicknesses and impedances of the layers.

The conventional piezoelectric element has very thin boundaries and launches waves of opposite polarity from front and back faces, as shown in FIG. 2A. Very wide bandwidth signals have been shown so that operation of the transducer can be examined using impulse response concepts. These waves are indicated in FIG. 2A by the functions —P(t—T) and P(t) for the back and front surfaces respectively, where T is the transit time across the piezoelectric element 4. The waves are shown after they have propagated some distance. (For the sake of clarity two negatively propagating waves have been suppressed from FIG. 2A.) The destructive resonance at $2f_0$ is a fundamental limitation of these conventional piezoelectric elements.

SUMMARY OF THE INVENTION

The present invention is an ultrasonic transducer which overcomes the destructive interference inherent in all transducers (plate and beam) comprising piezoelectric elements sandwiched between backing/matching layers. The basic principle of the invention is to cause the wave emanating from the back surface of the piezoelectric element to spread over time as if passed through a low-pass filter, while the wave emanating from the front surface remains unaltered. The combination of the two waves, at frequencies which would produce destructive interference in a conventional transducer, produces no destructive interference in an ultrasonic transducer in accordance with the invention.

The foregoing effect can be achieved in accordance with a first preferred embodiment of the invention by altering the texture of the transducer back surface. In particular, a roughened back surface is used to excite a distributed ultrasonic waveform, which is spread over time relative to the sharply defined waveform excited at the front surface. The back surface can be roughened, for example, by chemical etching or by knurling or cutting the surface with a diamond saw. This roughening of the back surface has the effect of lowpass filtering the wave emanating from the back surface and subsequently reducing its magnitude.

In accordance with a second preferred embodiment of the invention, an ultrasonic transducer is made having a spatially graded piezoelectric coupling. The piezoelectric coupling is varied in a manner that produces a low-pass filtering operation for only one of the two ultrasonic wave sources. In particular, the piezoelectric coupling has a spatial distribution that rises smoothly from zero at the back face, reaches a plateau and drops abruptly at the front face.

A spatial distribution of the piezoelectric coupling along the width of the piezoelectric element can be achieved by partially de-poling the piezoelectric material, e.g., by heating the back side of the piezoelectric element to a temperature above the Curie temperature while maintaining the front side of the element cold.

Ultrasonic transducers having a broadband transfer function can be produced using either of the preferred methods of manufacture. In contrast to conventional ultrasonic transducers wherein destructive interference results in fractional bandwidths of approximately 70%, incorporation of the invention in an ultrasonic transducer prevents destructive interference, thereby permitting arbitrary bandwidth.

Applying the teaching of this invention to the field of medical diagnostic imaging, multiband transducers can be readily designed with superior bandwidths. Also, very broadband signals may be used, which provides enhanced image quality.

DETAILED DESCRIPTION OF THE PREFERRED EMBODIMENTS

Figure 2A:
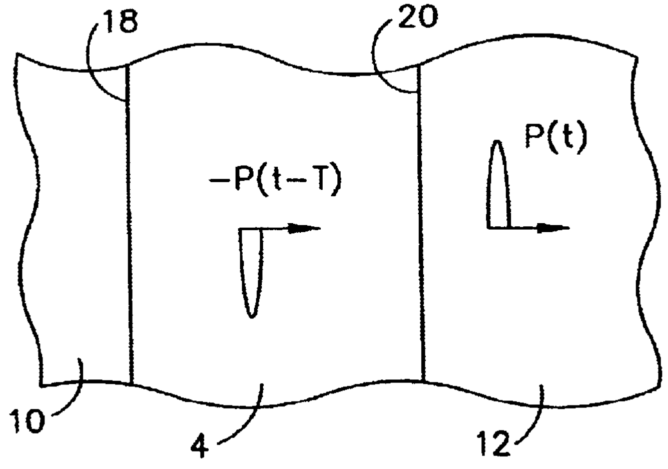
PRIOR ART FIG. 2A
FIGS. 2A and 2B are diagrams showing the pressure waveforms which radiate in the forward direction from the front and back surfaces of a piezoelectric element of a conventional ultrasonic transducer and of an ultrasonic transducer in accordance with a preferred embodiment of the invention, respectively.
Figure 2B:
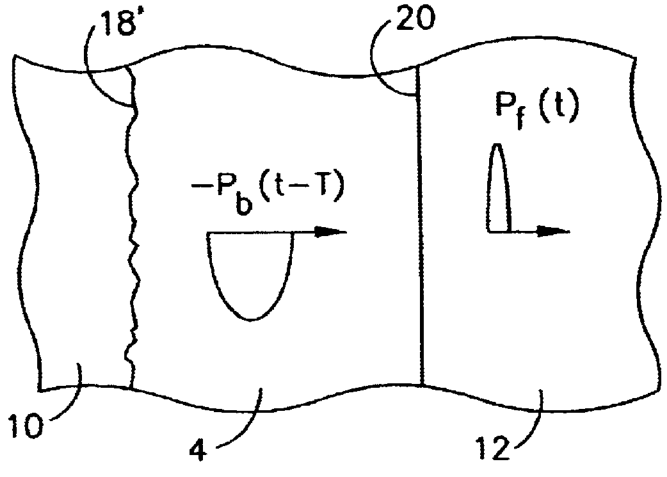

The basic structure of an ultrasonic transducer in accordance with a first preferred embodiment of the invention is shown in FIG. 2B. A piezoelectric element 4 is sandwiched between a backing layer 10 and a matching layer 12. The backing and matching layers are composites of epoxy and other bulk fillers in fine particulate form (e.g., metallic tungsten or aluminum oxide).

The front surface 20 of piezoelectric element 4 is smooth, forming a sharply defined boundary typical of conventional transducers. The back surface 18' has a rough texture. During activation of the piezoelectric element 4, back surface 18' will generate a propagating bulk wave having an extended impulse response that is equivalent to a low-pass filter. Since the wave from the rough surface is low-pass filtered, it will not destructively interfere with the wave generated by the front surface of the piezoelectric element.

The bulk plane wave produced by the roughened back surface has an impulse response that is the convolution of the excitation with the thickness function of the rough surface. Consequently, the wave from the back surface is very much extended in time. At low frequencies the operation of the transducer in FIG. 2B is very similar to the operation of the conventional transducer of FIG. 2A. The thickness of the back surface becomes very small in relationship to the wavelength of the wave, so that the signals from the front and back surfaces destructively interfere as the frequency approaches zero. For frequencies greater than the nominal halfwave resonance $f_0$, the operation is considerably different. The extended impulse response of the back surface operates as a low-pass filter. At frequency $2f_0$, where the transducer of FIG. 2A exhibits destructive interference, the transducer of FIG. 2B exhibits reduced or no destructive interference. Destructive interference is eliminated because the wave from the back surface has been low-pass filtered, thereby reducing the amplitude of the wave.

The improved bandwidth of the ultrasonic transducer in accordance with the first preferred embodiment of the invention can be demonstrated by an approximate analysis comparing its transfer function with that of a conventional transducer. The spectrum of the combined waves in the conventional transducer of FIG. 2A is given by $$H(f)-P(f)[1-e^{-j2\pi fT}] \qquad (1)$$

The transfer function is the product of the exciting wave P(f) and the combination of the two waves as is shown in the bracketed term of Eq. (1), where T is the transit time of the piezoelectric element. The term in brackets undergoes successive destructive interference at 0 and all even multiples of $f_0$. For the roughened surface element the combination of the two waves is given by $$H(f)-P(f)[1-R(f)e^{-j2\pi fT}] \qquad (2)$$

where the back surface roughness function R(r) is represented by its transform R(f). The physics of the rough surface requires that R(O) equal unity, so that the rough surface operates as a low-pass filter with unity magnitude at dc. The transfer function of Eq. (2) undergoes destructive interference at zero frequency. At frequencies near even multiples of $f_0$, the combination of the two terms in the brackets produces a result that depends upon the frequency response of R(f). For suitably selected functions for R(τ), the frequency response at $2f_0$approaches zero.

Figure 3A:
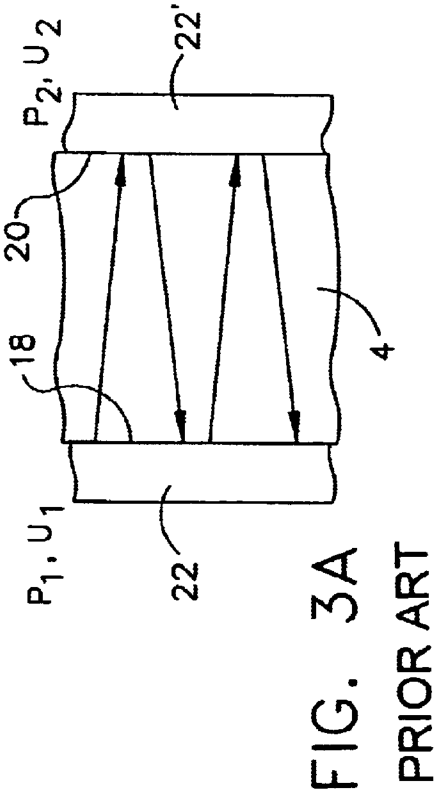
FIG. 3A PRIOR ART
FIGS. 3A and 3B are diagrams respectively showing the dynamics and the pressure waveforms of a bulk delay lines in the case where the piezoelectric material has two ideal thin boundaries.
Figure 4A:
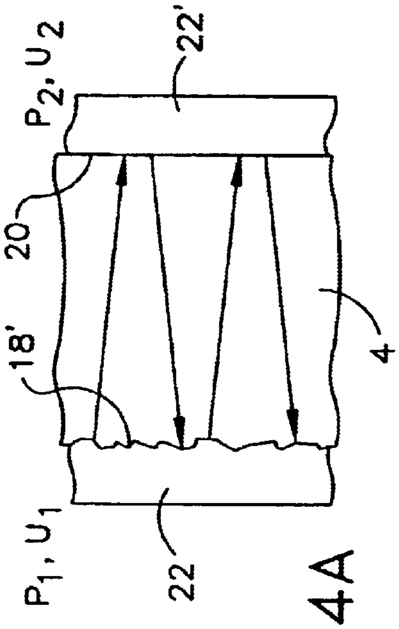
FIGS. 4A and 4B are diagrams respectively showing the dynamics and the pressure waveforms of a bulk delay lines in the case where the piezoelectric material has one ideal thin boundary and one roughened boundary.

An exact analysis requires a solution for the roughened piezoelectric element in complete coupling with the backing and front loading layers. The constituent relationship for the transmission line is derived using the constructions of FIGS. 3A and 4A. The conventional bulk wave transmission line is shown in FIG. 3A with clamped front and back surfaces. The clamps can impress velocity excursions on the bulk delay line, and resulting pressure waveforms can be studied.

Figure 3B:
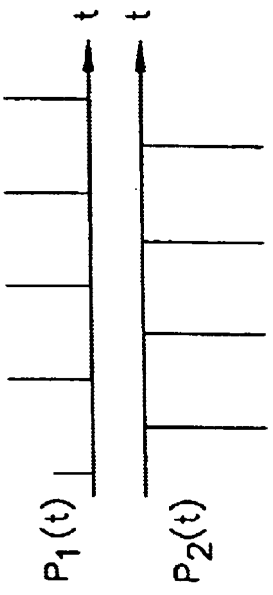
FIG. 3B PRIOR ART

The ideal transmission line is characterized by impulsively exciting the velocity at one surface and studying the pressure waveforms that arise at the two surfaces. As shown in FIG. 3A, the left surface has been impulsively excited (i.e., the velocity of the surface $U_1$ 0 for an instant, after which the condition $U_1=0$ is maintained by clamping; $U_2=0$ is maintained throughout) and pressure waves (i.e., pressure pulses of unity area shown in FIG. 3B) are seen at both surfaces. The waves traverse the piezoelectric element, reflecting perfectly from the clamped boundaries. As the waves strike the two surfaces, a force doubling occurs as each wave turns around. These waves are consistent with the Z transforms:

$$P_1(Z) = \frac{Z^2+1}{Z^2-1} \qquad (3)$$

$$P_2(Z) = \frac{-2Z}{Z^2-1} \qquad (4)$$

The Z operator is the familiar time shift operator Z=exp (sT). These Z transforms are the familiar terms in the expression coupling the two surfaces of a transmission line.

The equations for a Mason model is given in Eq. (5) using the front and back surface terminal variables and the electrical variables i and V. The Z transforms of Eqs. (3) and (4)

can be seen in the upper left elements of the matrix and represent the acoustic transmission line of the Mason model. The other terms of the Mason model are the electrostrictive mechanical coupling coefficient h, the dielectric constant at fixed strain $\epsilon^s$, the area of the plate A, and the acoustic impedance of the element $R_c$. The equations for the rough surface delay line can now be written by inspection.

$$\begin{vmatrix} p_1 \\ p_2 \\ V \end{vmatrix} = \begin{vmatrix} AR_c\frac{Z^2+1}{Z^2-1} & AR_c\frac{2Z}{Z^2-1} & \frac{h}{S} \\ AR_c\frac{2Z}{Z^2-1} & AR_c\frac{Z^2+1}{Z^2-1} & \frac{h}{S} \\ \frac{h}{S} & \frac{h}{S} & \frac{b}{A\varepsilon^S S} \end{vmatrix} \begin{vmatrix} u_1 \\ u_2 \\ i \end{vmatrix} \tag{5}$$

Figure 4B:
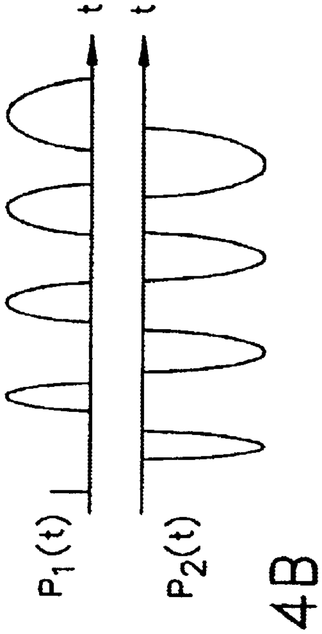

Consider the waves shown in FIG. 4B. They arise from exciting the roughened back surface 18' of a piezo-electric element with an impulse of velocity. A distributed wave propagates to the flat front surface 20 and is totally reflected. It returns to the rough back surface and progressively reflects. The progressive reflection acts to convolve the wave with the roughness. The pressure wave at the back surface is that of a double convolution of the surface roughness. Subsequent reflections from the front surface cause one additional convolution per round trip across the element. The resulting transforms are given by $$P_1(s) = \sum_{n=0}^{\infty} e^{-s2nT} R^n(S) + \sum_{n=1}^{\infty} e^{-s2nT} R^n(S) = \frac{e^{2sT} + R(S)}{e^{2sT} - R(s)} \tag{6}$$

$$P_2(s) = \frac{-2R(s)e^{sT}}{e^{2sT} - R(s)} \tag{7}$$

where advantage has been taken of the infinite sum of transforms of the form Rn(s) in forming the denominator of the functions.

Using these results the modified Mason model can be written as $$\begin{vmatrix} p_1 \\ p_2 \\ V \end{vmatrix} = \begin{vmatrix} AR_c\frac{e^{2sT}+R(s)}{e^{2sT}-R(s)} & \frac{AR_cR(s)2e^{sT}}{e^{2sT}-R(s)} & \frac{h}{S} \\ \frac{AR_cR(s)2e^{sT}}{e^{2sT}-R(s)} & AR_c\frac{e^{2sT}+R(s)}{e^{2sT}-R(s)} & \frac{h}{S} \\ \frac{h}{S} & \frac{h}{S} & \frac{b}{A\varepsilon^S S} \end{vmatrix} \begin{vmatrix} u_1 \\ u_2 \\ i \end{vmatrix} \tag{8}$$

where the terminal relations are as before and Eqs. (6) and (7) have been used. This modified equation can be used to model layered transducer structures by simple substitution of this expression into existing Mason models.

In accordance with a second preferred embodiment of the invention, destructive interference is eliminated by spatially varying the piezoelectric coupling in proximity to the back surface of the piezoelectric element. Spatial variation of the piezoelectric coupling produces a low-pass filter operation for one of the two wave sources, while leaving a sharply defined broadband source at the front surface.

Figure 5:
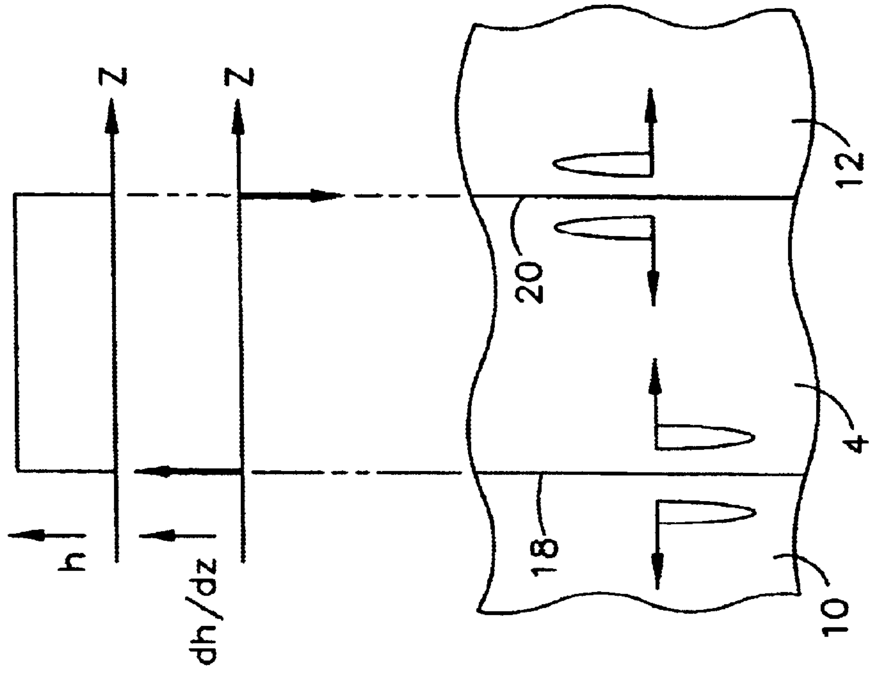
FIG. 5 PRIOR ART
FIG. 5 is a diagram showing the piezoelectric coupling and pressure waveforms which radiate from the front and back surfaces of the piezoelectric element of the conventional ultrasonic transducer.

The piezoelectric coupling for a conventional ultrasonic transducer is shown in FIG. 5. The piezoelectric coupling h is constant in the thickness direction of the piezoelectric element. The piezoelectric force arises from the spatial gradient of the coupling coefficient h. The spatial derivative of h is also shown in FIG. 5, indicating the distribution of the piezoelectric force. As can be seen, equal and opposite polarity waves are generated from the two impulsive sources of piezoelectric force. The forward- and backward-propagating waves are shown for both the front and back surfaces. The four waves arise from a broad bandwidth pulse being applied to the electrical terminals.

For the simple case of equal impedances, there are no reflections between layers, i.e.,. at interfaces 18 and 20. The transform of the forward-propagating waves is as set forth in Eq. (1), which shows the constructive and destructive interference in the bracketed term. For dc, the response is zero and the same is true for odd harmonics of the half-wave resonance. For even harmonics of the half-wave resonance, constructive interference occurs.

Figure 6:
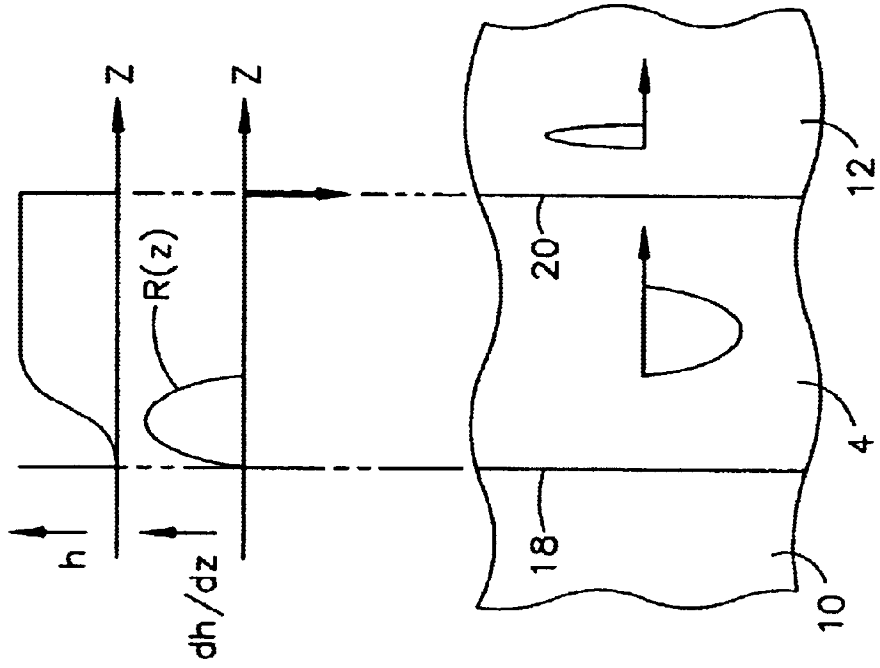
FIG. 6 is a diagram showing the piezoelectric coupling and pressure waveforms which radiate in the forward direction from the front and back surfaces of a piezoelectric element of an ultrasonic transducer in accordance with another preferred embodiment of the invention.

The operation of the broadband ultrasonic transducer in accordance with the second preferred embodiment is shown in FIG. 6. The piezoelectric coupling h has a spatial distribution that rises smoothly from zero at the back surface, achieves a plateau, and drops abruptly at the front surface. The spatial gradient of the coupling coefficient is shown with a broad function and a sharply defined source is indicated by an impulse. The impulse is identical to that of the conventional transducer shown in FIG. 5. The broadband source excites the piezoelectric material over its entire extent in the manner of a convolution. As a consequence, the wave from the broadband source is very much extended in time. The pressure wave $P_b(t)$ from the broadband source is the convolution of the mechanical excitation p(t) and the distribution function R(tc), where c is the speed of sound. The interaction of the forward-propagating waves from these two different sources forms the basis of the broadband operation of the transducer in accordance with the invention.

The transform of the forward-propagating waves for the broadband transducer is given by Eq. (2). This transform differs from that for the conventional transducer in that it includes the transform R(f) for the wave from the distributed source proximate to the back surface. The dc value of Eq. (2) is zero, since the area of the broad source and the thin source must be equal (due to the derivative relationship). The distributed source operates as a low-pass filter with frequency response R(f). As the frequency increases from zero the response of R(f) becomes less and less. At the half-wave frequency the constructive interference is simply 1+R(f), but R(f) should be less than unity for a reasonable design. At the destructive frequency of $2f_0$, the value of R(f) should be even less. Consequently, destructive interference, which is the principal bandwidth limiting mechanism, is nonexistent for a reasonable choice of R(z) and R(f).

It is well known that the constituents of certain ceramic materials can be physically reorganized by heating the material to a temperature in excess of the Curie temperature while maintaining an electric field across the material. The electric field organizes some atoms into electric domains that produce the piezoelectric effect. This reorganization is retained when the material is quenched. This process is commonly referred to as "poling".

Conversely, the piezoelectric material can be "depoled" by applying no electric field during heating and cooling. This effect can be utilized to construct a piezoelectric material having a spatial distribution of the piezoelectric coupling in the thickness direction. The desired spatial distribution can be achieved by heating the back side of the piezoelectric element to a temperature above the Curie temperature while maintaining the front side of the element cold (i.e., at a temperature below the Curie temperature) in the absence of an electric field and then quenching. This process causes the piezoelectric material proximate to the back surface to be progressively de-poled, with maximum depoling taking place at the back surface itself, where h=0.

Figure 1:
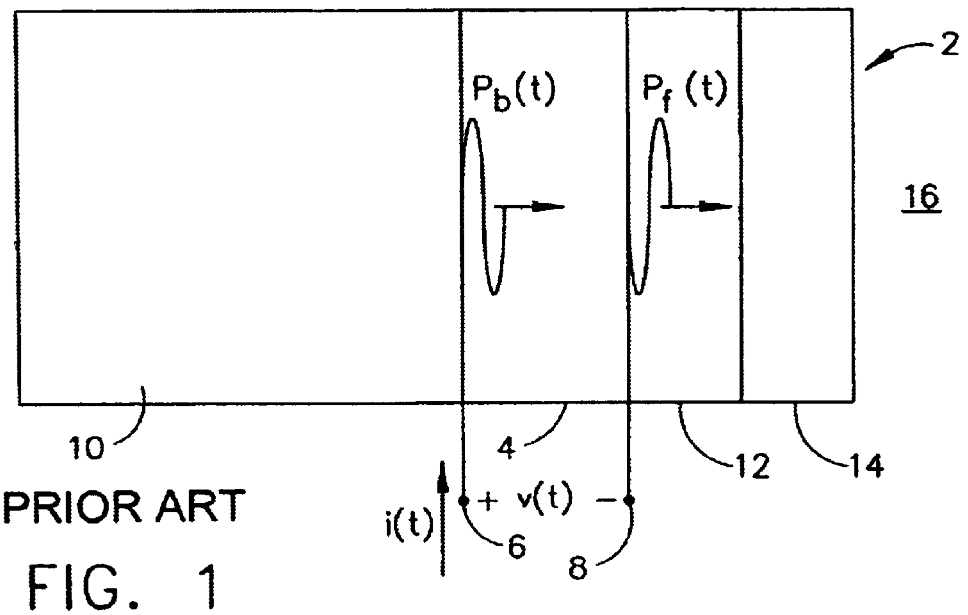
PRIOR ART FIG. 1
FIG. 1 is a diagram showing the basic structure of a conventional ultrasonic transducer.

The simplified ultrasonic transducer discussed above had only one impedance for the piezoelectric element and its loads. Therefore no reflections occurred at the interfaces between the piezoelectric element and its loads. As a result the transfer function between the excitation and the forward-propagating waves was very simple. In practice, the transducer would have a multilayer structure like that shown in FIG. 1. The solution is a system matrix similar to the one in Eq. (5).

The foregoing preferred embodiments have been disclosed for the purpose of illustration. Variations and modifications of the disclosed preferred embodiments will be readily apparent to practitioners skilled in the art of ultrasonic transducers. For example, other methods can be used to roughen the back surface of the piezoelectric element. Also other methods could be used to spatially vary the piezoelectric coupling. All such variations and modifications are intended to be encompassed by the claims set forth hereinafter.

I claim:

1. In a broadband ultrasonic transducer comprising a layer of piezoelectric material sandwiched between a layer of backing material and a layer of matching material, said piezoelectric layer having a back surface to which said backing layer is bonded and a front surface to which said matching layer is bonded, and means for applying a varying voltage across said piezoelectric layer which produces a first exciting wave at said front surface and a second exciting wave at said back surface. said front surface of said piezoelectric layer having a smoothness which does not low-pass filter said first exciting wave and produces a first forward-propagating wave having a first waveform and a first polarity which emanates from said front surface, the improvement wherein said back surface of said piezoelectric layer has a rough texture which low-pass filters said second exciting wave to produce a second forward-propagating wave emanating from said back surface has a second waveform different than said first waveform and a second polarity opposite to said first polarity, thereby mitigating destructive interference between said first and second forward-propagating waves when the frequency of said exciting waves is an even multiple of the half-wave frequency for said piezoelectric layer.

2. The broadband ultrasonic transducer as defined in claim 1, wherein said rough texture of said back surface of said piezoelectric layer is formed by knurling.

3. The broadband ultrasonic transducer as defined in claim 1, wherein said rough texture of said back surface of said piezoelectric layer is formed by chemical etching.

4. The broadband ultrasonic transducer as defined in claim 1; wherein the roughness of said back surface of said piezoelectric layer is greater than the roughness of said front surface of said piezoelectric layer.

5. In a broadband ultrasonic transducer comprising a layer of piezoelectric material sandwiched between a layer of backing material and a layer of matching material, said piezoelectric layer having a back surface to which said backing layer is bonded and a front surface to which said matching layer is bonded, and means for applying a varying voltage across said piezoelectric layer, the improvement wherein said piezoelectric layer comprises means for providing a piezoelectric coupling which varies gradually in a thickness direction across a portion of said piezoelectric layer which is proximate to said back surface such that a forward-propagating wave emanating from said portion of varying piezoelectric coupling in response to said varying voltage does not destructively interfere with a forward-propagating wave emanating from said front surface in response to said varying voltage when the frequency of said waves is an even multiple of the half-wave frequency for said piezoelectric layer, wherein the piezoelectric coupling is zero at said back surface, gradually increases in said thickness direction from zero to a predetermined value over a portion of said piezoelectric layer which is proximate to said back surface, and stays constant at said predetermined value over the remaining portion of said piezoelectric layer.

6. In a broadband ultrasonic transducer comprising a layer of piezoelectric material sandwiched between a layer of backing material and a layer of matching material, said piezoelectric layer having a back surface to which said backing layer is bonded and a front surface to which said matching layer is bonded, and means for applying a varying voltage across said piezoelectric layer, the improvement wherein said piezoelectric layer comprises means for providing a piezoelectric coupling which varies gradually in a thickness direction across a portion of said piezoelectric layer which is proximate to said back surface such that a forward-propagating wave emanating from said portion of varying piezoelectric coupling in response to said varying voltage does not destructively interfere with a forward-propagating wave emanating from said front surface in response to said varying voltage when the frequency of said waves is an even multiple of the half-wave frequency for said piezoelectric layer, said gradual variation in the piezoelectric coupling in said thickness direction being produced by partial de-poling of said piezoelectric layer.

7. The broadband ultrasonic transducer as defined in claim 1, wherein said piezoelectric layer is a plate of said piezoelectric material.

8. The broadband ultrasonic transducer as defined in claim 1, wherein said piezoelectric layer is a beam of said piezoelectric material.

* * * * *